PRINTED CIRCUIT BOARD RESTRAINING MEANS

Filed Oct. 14, 1959

INVENTOR
Stewart M. Shaffer

BY Robert T. Killman
ATTORNEY

United States Patent Office 3,059,153 Patented Oct. 16, 1962

3,059,153
PRINTED CIRCUIT BOARD RESTRAINING MEANS

Stewart M. Shaffer, Orlando, Fla., assignor to The Bendix Corporation, Towson, Md., a corporation of Delaware
Filed Oct. 14, 1959, Ser. No. 846,314
2 Claims. (Cl. 317—101)

This invention relates generally to printed circuit boards and more particularly to a novel arrangement for securing components to such boards.

Printed circuit is the term which has become generic to preformed wiring patterns of conductive material on a dielectric sheet which is formed by any one of the number of processes to provide an economical and uniform circuit connection pattern among a plurality of terminals and components which may be mounted to the dielectric sheet. While one of the advantages of printed circuit boards has been the economy offered by the elimination of the cost of labor required to wire individual connections and the adaptability of such construction to automated procedures and automated equipment, the preformed wiring offers further advantages in improved reliability since once a correct pattern is obtained an extremely large number of boards can be reproduced without introducing errors due to incorrect wiring connections. In view of the foregoing and other advantages, printed circuit boards have now been incorporated into equipment wherein the aspect of reliability is paramount in comparison to the advantages of economy or ease of production. Applications of this type include military and aircraft equipment generally, as well as other services where human life or large scale activities depend upon the sustained operation of equipment, the reliability of which depends upon subcomponent assemblies of electronic parts. As electronic equipment is adapted for such uses the reliability specifications inevitably rise in comparison to mass produced and low cost equipment. In printed circuit board assemblies, in particular, it has been found that prior art techniques are inadequate to provide the degree of reliability called for in high reliability installations.

It is an object of the present invention to provide improved retaining means in a printed circuit board which is compatible with the assembly operations, including automated assembly, of the board and its components which renders the assembled board and components capable of withstanding severe vibration without mechanical and electrical failure.

A further object of the invention is to provide a clip which can be used in a printed circuit assembly and which itself is assembled by printed circuit techniques such as dip-soldering and which when used in combination with components having leads which are dip-soldered provides a compact assembly for the support of the components.

These and other objects of the invention will be apparent from the detailed description which follows taken in conjunction with the accompanying drawing wherein.

In accordance with the invention, an assembly of components with a retaining clip is mounted on a printed circuit board with the leads of the components and projecting prongs from the clip passing through holes in the board to permit the clip and the components to be dip-soldered in one operation thereby electrically to connect the components and mechanically secure the clip and components in a compact assembly.

Figure 1:
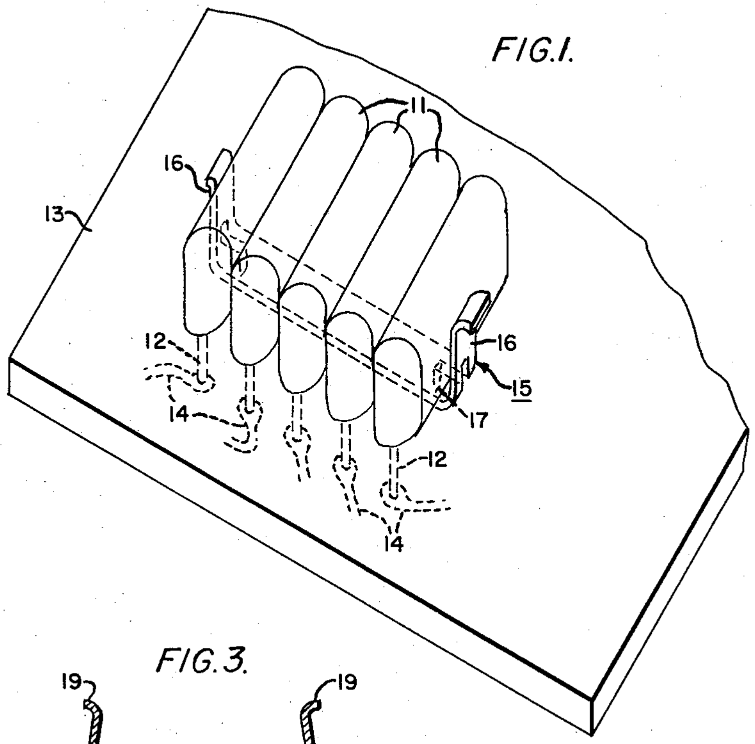
FIG. 1 is a perspective view of a plurality of components assembled to a printed circuit board in combination with a clip made in accordance with the invention.
Figure 4:
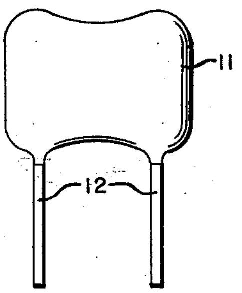
FIG. 4 is an elevation view of a component.

Referring to FIG. 1 a printed circuit assembly is shown having a plurality of components 11 of the type shown in FIG. 4 with leads 12 which extend from the components 11 on the same side thereof. The leads 12 project through spaced holes in a board 13 which communicate with preformed wiring paths 14 on the opposite surface of the board 13. The leads 12 and the conductors 14 are generally joined by a conventional dip-solder process thereby simultaneously completing all connections with a solder bond. The plurality of units 11 is secured in a clip 15 which provides a pair of upright members 16 suitably spaced to retain a predetermined number of the components 11 therebetween with a slight spring tension applied thereto by the members 16. The clip 15 is secured to the board 13 by means of tabs 17 projecting through the board 13 and positioned relative to a conductive area such that the tabs 17 are secured by a solder bond thereto when the board 13 is dip-soldered.

Figure 3:
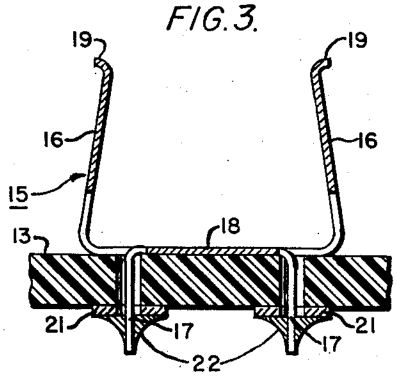
FIG. 3 is a sectional view along line 2—2 of FIG. 2 of a clip shown positioned relative to a printed circuit board in accordance with the invention.
Figure 2:
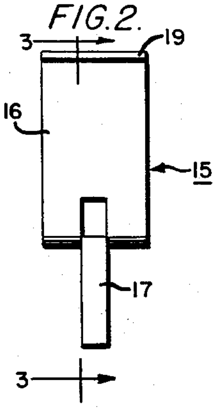
FIG. 2 is an end elevation of a clip made in accordance with the invention.

The details of the construction and use of the clip 15 are shown in FIGS. 2 and 3. In FIG. 3 the clip 15 is shown in section in assembled position with the printed circuit board 13 illustrating the details of mounting the clip 15. The clip 15 is formed of a strip of spring material of suitable width taking into consideration the size of components 11 to be retained thereby. The material of the strip may be spring tempered Phosphor bronze or similar material. The strip is formed to have a base portion 18 separating the two upright portions 16 which terminate in curved ends 19. The upright portions 16 may converge slightly to provide spring tension against the components 11 when a suitable number are inserted therebetween the total thickness of which corresponds generally with the length of the base portion 18. Prior to forming the upright portion 16 the strip 18 may be stamped to cut out central tabs 17 which are formed by making two U-shaped cuts with the bottom of the U in the portion of the strip which will form the arms 16. Thus, the tab 17 may be bent downwardly as shown to provide mounting members for the clip 15 upon projection through suitably spaced holes in the board 13 and associated conductive areas 21. One or more of the areas 21 may be connected in the circuit of the board 13 such as a connection to ground potential, for example. Upon dip-soldering of the board 13 suitable solder bonds 22 are formed securing the tabs 17 and thus the clip 15 to the board 13. By providing an appropriate length for the parallel portions of the U-shaped cut in the strip 18 and controlling the point at which the bend to form the tab 17 is made the spacing between the tabs 17 can be selectively controlled as required by physical dimensions of the circuit.

Many modifications of the invention will now be apparent. The extremely simple clip of the preferred disclosed embodiment may be adapted for various size and shape components and conventional assembly techniques can be employed. By providing spring bias support which is firmly based on the surface of the printed circuit board, the failure of components having leads extending through holes in the circuit board is completely eliminated. Without the use of the clip assembly of the present invention vibration of such components mounted merely by means of the lead connections through holes in the board has produced failures in a matter of a few minutes vibration test. Thus, circuits assembled in accordance with the present invention provide a great improvement in reliability with a substantially negligible increase in cost.

The invention has been described in terms of the present preferred embodiment thereof which is to be considered as illustrative only. The invention itself is to be limited, however, only by the scope of the appended claims.

I claim:

1. A printed circuit board for supporting and connecting a plurality of components comprising a dielectric sheet having therein two spaced rows of holes and two additional holes between said rows, a conductive pattern on one surface of said sheet having conductor areas adjacent said holes, a plurality of components each having two leads projecting in the same direction from an edge thereof, said leads being inserted in corresponding holes of said rows to mount said components in side-by-side adjacent positions, an upwardly open U-shape spring clip having downwardly projecting spaced tabs projecting through said additional holes, the distance between the upright portions of said clip being less than the side-by-side aggregate dimension of said components, solder connections on said one surface bonding said leads and said tabs to said adjacent conductor areas respectively, the bottom of said clip extending in contact with the other surface of said sheet beneath said components between said leads.

2. The combination according to claim 1 in which said clip has a flat bottom portion and said upright portions converge toward each other at their free ends.

References Cited in the file of this patent

UNITED STATES PATENTS

| | | |
|---|---|---|
| 1,546,801 | Sorensen | July 21, 1925 |
| 2,151,762 | Hitchcock | Mar. 28, 1939 |
| 2,229,989 | Roby | Jan. 28, 1941 |
| 2,808,575 | Karlson | Oct. 1, 1957 |
| 2,810,872 | Nord | Oct. 22, 1957 |
| 2,869,041 | De Cola | Jan. 13, 1959 |
| 2,898,518 | Lynn | Aug. 4, 1959 |
| 2,935,654 | Gittens | May 3, 1960 |

OTHER REFERENCES

Tele-Tech and Electronic Industries, November, 1953; page 47.